(12) United States Patent
Doan

(10) Patent No.: US 7,911,014 B2
(45) Date of Patent: Mar. 22, 2011

(54) ON CHIP ANTENNA AND METHOD OF MANUFACTURING THE SAME

(76) Inventor: My The Doan, Calgary (CA)

( * ) Notice: Subject to any disclaimer, the term of this patent is extended or adjusted under 35 U.S.C. 154(b) by 226 days.

(21) Appl. No.: 12/241,031

(22) Filed: Sep. 29, 2008

(65) Prior Publication Data
US 2009/0085133 A1 Apr. 2, 2009

Related U.S. Application Data

(60) Provisional application No. 60/976,412, filed on Sep. 29, 2007.

(51) Int. Cl.
*H01L 27/14* (2006.01)
(52) U.S. Cl. ............... 257/428; 257/531; 257/E31.001; 438/59; 438/73; 438/463; 438/676; 438/767
(58) Field of Classification Search .................. 257/428, 257/531, E31.001; 438/59, 73, 463, 676, 438/767
See application file for complete search history.

(56) References Cited

U.S. PATENT DOCUMENTS

| | | |
|---|---|---|
| 5,539,241 A | 7/1996 | Abidi et al. |
| 2003/0104649 A1 | 6/2003 | Ozgur et al. |

OTHER PUBLICATIONS

K. K. O, et al, "The feasibility of on-chip interconnection using antennas," in Proceedings of the IEEE/ACM Computer-Aided Design, pp. 979-984, 2005.

R. N. Simons, et al, "RF telemetry system for an implantable Bio-MEMS sensor," in Proc. IEEE MTT-S, pp. 1433-1436, 2004.

J. N. Burghartz, et al, "Spiral inductors and transmission lines in silicon technology using copper damascene interconnects and low-loss substrates," IEEE Trans. Microw. Theory Tech., vol. 45, No. 10, pp. 1961-1968, 1997.

J.Y.-C. Chang, A. A. Abidi, and M. Gaitan, "Large suspended inductors on silicon and their use in a 2 um CMOS RF amplifier," IEEE Electron Device Lett., vol. 14, No. 5, pp. 246-248, 1993.

M. Ozgur, M. E. Zaghloul, and M. Gaitan, "Optimization of backside micromachined CMOS inductors for RF applications," in Proc. IEEE Int. Symp. Circuits Syst, pp. V-185-188, 2000.

L. H. Guo, et al, "A small OCA on a 1 0.5-mm2 2.45-GHz RFID Tag—design and integration based on a CMOS-compatible manufacturing technology," IEEE Electron Device Lett., vol. 27, pp. 96-98, 2006.

W. G. Yeoh, et al, "A 2.45-GHz RFID tag with on-chip antenna," in IEEE RFIC Symp. Dig., 2006.

(Continued)

*Primary Examiner* — Tan N Tran

(57) ABSTRACT

An antenna with air-filled trench is integrated with a radio frequency (RF) circuit. The trench locates directly under the metal lines that made up the antenna and is formed by etching from the back side of the semiconductor substrate until all the substrate material in the trench is removed. The air-filled trench greatly reduces the losses due to the semiconductor substrate; therefore the performance of the antenna improves greatly. When the antenna is a large planar spiral inductor, the air-filled trench means the semiconductor substrate inside the spiral inductor is untouched; hence integrated circuit can be built inside the antenna and on that substrate. Therefore the RF integrated circuit has a smaller size. Air-filled trench can also be used to reduce the semiconductor substrate noise coupling between digital circuit block and analog/RF circuit block. This air-filled trench and the air-filled trench under the antenna are formed at the same time.

7 Claims, 7 Drawing Sheets

OTHER PUBLICATIONS

C. P. Yue and S. S. Wong, "On-chip spiral inductors with patterned ground shields for Si-based RF ICs," IEEE J. Solid-State Circuits, vol. 33, pp. 743-752, 1998.

K.Grenier, et al, "MENS IC Concept for advanced RF and Millimeterwave Communications," IEEE International Workshop on Radio-Frequency Integration Technology, Nov. 30-Dec. 2, 2005, Singapore, pp. 135-138.

E. Öjefors, et al, "Micromachined Inverted F Antenna for Integration on Low Resistivity Silicon Substrates," IEEE Microwave and Wireless Components Letters, vol. 15, No. 10, Oct. 2005, pp. 627-629.

ON CHIP ANTENNA AND METHOD OF MANUFACTURING THE SAME

CROSS REFERENCE TO RELATED APPLICATIONS

This application claims the benefit of U.S. provisional Patent Application No. 60/976,412, filed Sep. 29, 2007, the contents of which are hereby incorporated by reference as if stated herein.

BACKGROUND OF THE INVENTION (1) Field of the Invention

The present invention generally relates to a wireless integrated circuit having an embedded antenna on chip. More particularly, this invention relates to the design and manufacturing of the embedded antenna with air-filled trench that would improve the performance of the wireless integrated circuit while reducing cost.

(2) Description of the Prior Art

For short range, and low power transceivers, on chip antennas are preferred as they generally offer lower cost and higher reliability when compare to off chip antennas. Typically, there are two methods of transmitting electromagnetic waves (or signals) between the transmitter and the receiver: backscattering and inductive coupling. The dipole, slot and patch antennas are used in backscattering method. While spiral inductors, or loop antennas are used in inductive coupling. Inductive coupling is meant for used in short range communication, i.e. typically less than a meter. Because the field produced by the small dipole loop antenna is not a propagating wave, but rather an attenuating wave, the field strength falls off with r sup. −3, where r is the distance between the transmitting and receiving antennas. The time varying magnetic field generated from the transmitting antenna of the reader, through inductive coupling, would induce a voltage across the tag's antenna terminal. This voltage is utilized to power the passive tag device. The induced voltage is proportional to the quality factor, Q, of the antenna. In another word, the read range between the transmitting and receiving RF devices is affected by the Q of antenna and tuning circuit.

In article "The feasibility of on-chip interconnection using antennas," in Proceedings of the IEEE/ACM Computer-Aided Design, pp. 979-984, 2005, O and his co-authors describe the design of on chip dipole antennas for inter-chip and intra-chip wireless communication. Whereas, Simons et al presents the results of spiral inductor/antenna used in a RF telemetry system for an implantable Bio-MEMS Sensor in article "RF telemetry system for an implantable Bio-MEMS sensor," in Proc. IEEE MTT-S, pp. 1433-1436, 2004.

Any antennas fabricated on silicon substrate would have substrate effects in the millimeter wave range that would reduce the antenna efficiency. The doped silicon substrate that often found in standard CMOS and Bipolar integrated circuits is considered as lossy, due to its resistive conductivity. Time varying signal travels along metal line or polysilicon line would generate electric field and magnetic field that penetrate in the silicon substrate. The electric field would induced substrate current, whereas the magnetic field would induced eddy currents at high frequency, e.g. Giga Hertz range and beyond. More specifically, capacitive impedance, $Z_c$, which represents the dielectric between the signal line and the substrate, is getting smaller at high frequency. Thus signal would capacitively couple to the conductive silicon substrate, inducing substrate current. With a resistive conductive substrate, this leakage substrate current would result in a resistive power loss. As for the time varying magnetic field, it induces an image current, which flows in the opposite direction, in the conductive ground substrate. So again a percentage of the signal would be loss. In addition to giving rise to power loss, according to Lenz's law, eddy currents create their own magnetic fields that is in the opposite direction of those of the signal line. This decreases the inductance of the line. For spiral inductor, this amounts to a reduction in quality factor, Q. To minimize the substrate loss, various methods: high resistivity silicon substrate, e.g. >1000 ohm.cm, removing the silicon, increasing the effective dielectric thickness between the signal lines and the silicon substrate, and implementing patterned ground shields can be used. However, each one of these methods does have its drawbacks.

High resistivity, HR, substrate, as described by Burghartz, et al, "Spiral inductors and transmission lines in silicon technology using copper damascene interconnects and low-loss substrates," IEEE Trans. Microw. Theory Tech., vol. 45, no. 10, pp. 1961-1968, 1997, is expensive, has much higher crystal defects, and increases latch up. However, with high resistivity silicon in the "handle" substrate (below the buried oxide) in a silicon-on-insulator, SOI, wafer, the crystal defects and latch up problems are not relevant. The HR-SOI wafers are expensive and rare, though.

U.S. Pat. No. 5,539,241 described a method to remove some or all silicon beneath the inductor by etching from the top, leaving the inductor suspended over a pit. The pit is filled with air, which is an ideal dielectric. The capacitive coupling would be much smaller. Hence the self resonance frequency of the inductor would move higher, ideally higher than the design frequency. Since the inductor is suspended, it is less mechanically stable. It is also susceptible to vibration, which causes low frequency interference, and it introduces internal stress to the surrounding area. The former phenomenon affects the circuit performance, while the latter degrades the yield of the circuit. Moreover, this method can not be applied for applications described above by Simons et al in their implantable Bio-MEMS sensor or in RFIC tag as described by Yeoh et al, "A 2.45-GHz RFID tag with on-chip antenna," in IEEE RFIC Symp. Dig., 2006, because it would etch away the circuits which lie within the inductors.

US patent application, 20030104649, and in article "Optimization of back side micromachined CMOS inductors for RF applications," in Proc. IEEE Int. Symp. Circuits Syst, pp. V-185-188, 2000, Ozgur et al describe another method to remove all silicon beneath the inductor. This time is by back side micromachining. Again because a very large structure is suspended, internal stress to the surrounding area is a concern. To resolve this issue, the authors deposit a stress compensation layer on the area that would be suspended before doing the back side micromachining. Using this technique, the authors claim that passive circuits occupying areas larger than 2 mm×3 mm has been micro-machined and packaged successfully. However, this method also can not be applied for applications described above by Simons et al in their implantable Bio-MEMS sensor or in RFIC tag as described by Yeoh et al, because it would etch away the circuits placing within the inductors.

Guo, et al, as described in an article "A small OCA on a 1 0.5-mm2 2.45-GHz RFID Tag—design and integration based on a CMOS-compatible manufacturing technology," IEEE Electron Device Lett., vol. 27, pp. 96-98, 2006, neither remove the silicon underneath the inductors nor use a high resistivity silicon substrate. Instead, they deposit a very thick dielectric film, e.g. more than 15 um, in between the top metal line and the silicon substrate. The inductor is built using the top metal line. Doing this, they reduce the coupling capacitance between the inductor and the silicon substrate; thus increase the resonance frequency of the inductor. In other words, they reduce the loss due to substrate effects at the frequency they choose for the circuit to operate. The authors claim to have to overcome many challenges associated with this method. Challenges such as: wafer warps due to thick dielectric, severe polymer builds up due to deep via etch, and of filling the 15 um deep via with copper.

A patterned ground shield using poly layer, as described by Yue et al, in "On-chip spiral inductors with patterned ground shields for Si-based RF ICs," IEEE J. Solid-State Circuits, vol. 33, pp. 743-752, 1998, is inserted between the inductor and the silicon substrate to minimize the electric field penetration to the silicon substrate. Depending on the size of the inductors, quality factor, Q, improves only by 10% to 30%, while self-resonant frequency reduces. Q is a performance parameter of the inductor. It is defined as the ratio of the energy that is stored in the reactive portion of the component over the energy that is lost in the resistive portion of the component.

Among the above mentioned methods, removing silicon beneath the device gave the highest boost to the performance of the device, e.g. higher Q and higher resonant frequency.

SUMMARY OF THE INVENTION

It is therefore an object of the present invention to provide an improved method to reduce the substrate effects.

Other objects will appear hereinafter.

The objects of this invention are achieved in the following manner. After all the processing steps on the front side of the wafer completed, the wafer will be thin down to a predetermined thickness. Then after back side clean, standard photolithography processing steps proceed. The trenches' features are aligned to the alignment marks on the front side of the substrate. The trenches lie beneath the metal lines that made up the antennas. The next step is to etch silicon in the areas that are opened by the photolithography process from the back side of the wafer until reaching the bottom of the dielectric layer on the front side of the wafer. The final steps are clean, resist strip and clean. It is best that the antenna elements are placed near the edge of the die and that will be where photolithography mask is opened and the silicon is etched.

Another embodiment of the invention is related to additional processing steps when silicon-on-insulator, SOI, substrate is used, instead of bulk silicon.

In a further embodiment of the present invention, electrically isolated trenches are created. One application is to use them to reduce noise coupling among circuit blocks.

The above and other objects, features and advantages of the present invention will be better understood from the following detailed description taken in conjunction with the accompanying drawings.

DESCRIPTION OF THE PREFERRED EMBODIMENT

Figure 1A:
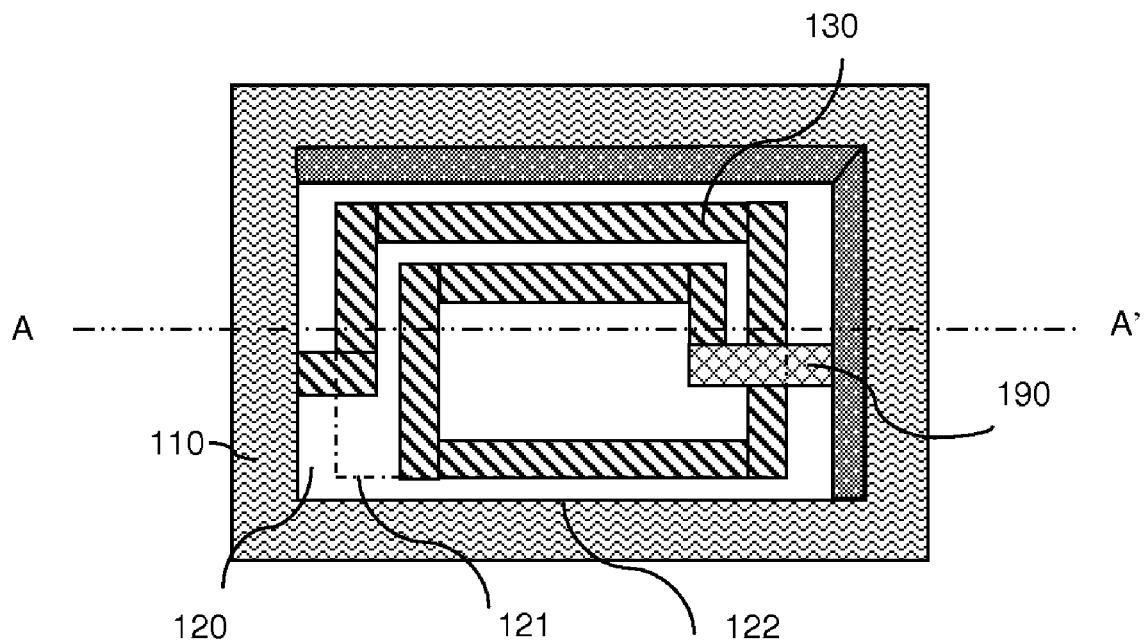
FIG. 1 shows bottom and side views of a prior art back side micro-machined CMOS inductor.
Figure 1B:
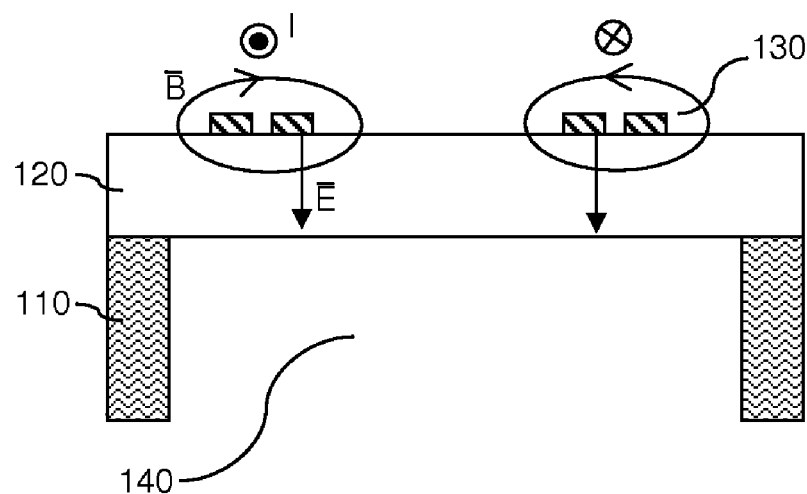

Referred now to FIGS. 1a and b, a prior art that used back side micro-machining to remove the silicon substrate, 110, under an inductor. The prior art belongs to Ozgur et al as mentioned in the background section. FIG. 1a is a bottom view of the inductor. FIG. 1b is a side view of the cross-sectional cut at A-A' in FIG. 1a. An air-filled trench, 140, is formed under the inductor after the silicon is removed. It is important to point out that the area of the trench as defined by the boundary, 122, is larger than that of the inductor. The area of the inductor, 121, is defined by the boundary of outer edge of the outermost line of the inductor, 130. In another word, all the silicon inside the boundary 122 is removed. As the authors pointed out, for large inductor they encounter stress problem. To resolve this issue, the authors deposit a stress compensation layer on top of the inductor before doing the back side micromachining. They were able to build a 2 mm×3 mm suspended inductor with the stress compensation layer.

Figure 2:
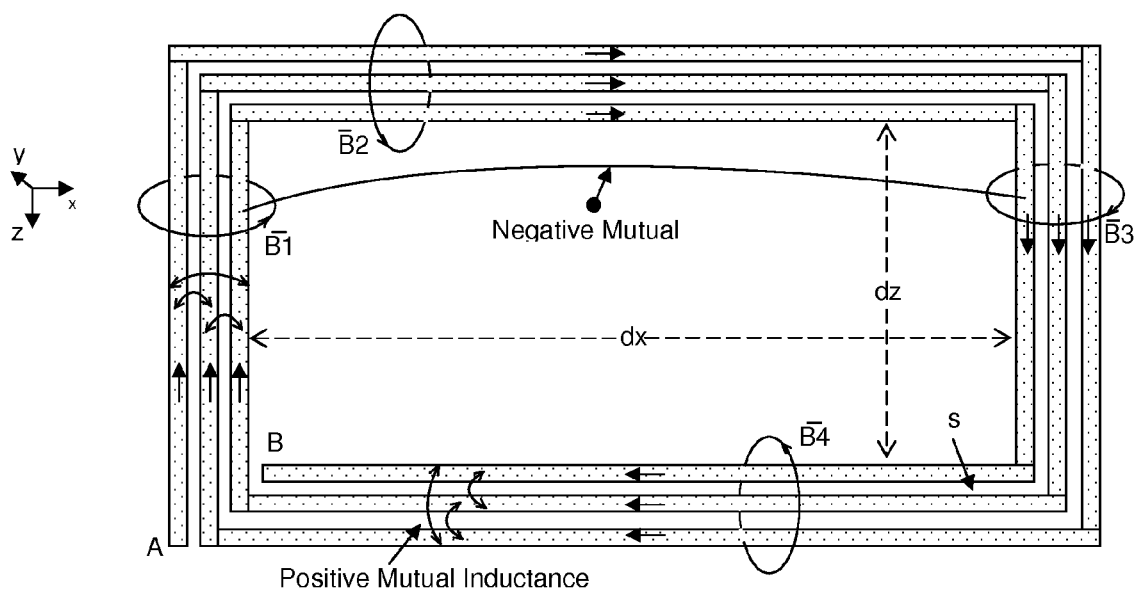
FIG. 2 illustrates the positive and negative mutual inductance of a planar spiral inductor.

Now let us examine how the various electromagnetic fields interact in the planar spiral inductor. FIG. 2 illustrates the positive and negative mutual inductance of a rectangular planar spiral inductor. In this case, the alternate current is flowed in point A, the bottom of the left-most metal line of the planar spiral inductor. The current would then loop around in the clock-wise direction 3 times and then exit at point B and then to the other parts of the circuit. Deducing from Lenz's law, currents flow in the same direction in parallel lines would create positive mutual inductance. As shown, B1 represents the total inductance, self inductances plus positive mutual inductances among the three lines on the left of the spiral inductor. Similarly B2 is the total inductance of 3 top lines; B3 is the total inductance of 3 right lines; and B4 is the total inductance of 3 bottom lines. On the other hand, negative mutual inductance would be the result of currents flow in the opposite direction in parallel lines. Each of the three lines in the left side of the spiral inductor would have a negative mutual inductance of each of the three lines in the right side of the spiral inductor. The mutual inductance is larger for narrower space as the magnetic coupling is enhanced. For the case, dx is much larger than the width of the lines and the spacing among the lines, s, the negative mutual inductance between B1 and B3 would be very small. Similarly, for large dz, there is negligible negative mutual inductance between B2 and B4. Finally, two lines orthogonal to each other have no mutual coupling since their magnetic fluxes are not linked together.

As mentioned in the introduction, there are eddy current, due to skin effect and proximity effect, which would reduce the total current and hence the inductance and Q. There are eddy losses among the lines in B1, among the lines in B2 and so on, but there are negligible eddy loss due to mutual inductance between B1 and B3, and between B2 and B4 if dx and dz are much larger than s, the spacing between the lines. In another word, eddy loss is dominated by local effects, not global effects.

As for the loss due to capacitive coupling to the lossy silicon substrate, it also is dominated by local effects. That is the loss path is "directly" down to the silicon beneath the line.

Figure 3A:
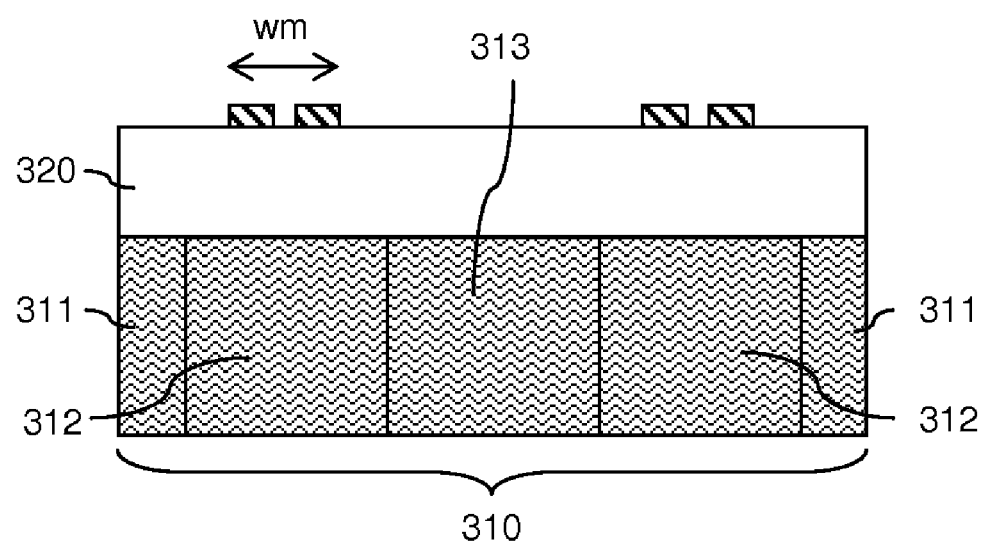
FIG. 3 shows the cross section view of a CMOS inductor which addresses the first embodiment of this invention.
Figure 3B:
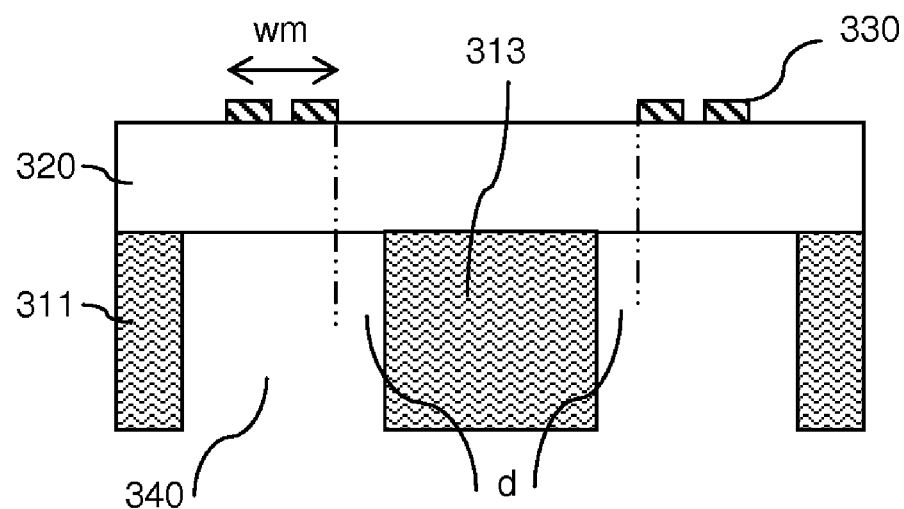

Now referred to FIG. 3a and FIG. 3b wherein said the preferred embodiment is illustrated. FIG. 3a shows a cross section view of a standard two turns spiral inductor sitting on an insulator, 320, and a lossy semiconductor substrate, 310. For the purpose of showing the differences among the preferred embodiment, the prior art and a standard inductor, the semiconductor substrate is divided into 3 regions. Region 1, 311, represents parts of the substrate lying outside the inductor. Region 2, 312, represents parts of the substrate lying under the conducting lines that made up the inductor. Region 3, 313, represents part of the substrate lying inside the inductor. In prior art regions 2 and 3 would be etched off. Whereas, in the preferred embodiment only region 2 is etched off, leaving region 3, 313, remain. As mentioned above, the capacitive loss and the eddy loss are dominated by local effects. That is most of the losses are in region 2, 312, where most of the electric and magnetic fields penetrate the lossy semiconductor substrate. There is negligible loss in region 3. In another word, the quality factor and the inductance of the inductor when the substrate is totally removed under the inductor as shown in FIG. 1, a prior art, are almost the same as those of the inductor when the substrate is partially removed, as shown in FIG. 3b.

In FIG. 3b, there is a distance, d, where the air-filled trench, resulting from etching off region 2, is extended beyond the total width, wm, of the metal lines that made up the inductor. This is to reduce the edge effects.

Now, the advantages of leaving a semiconductor island inside the inductor, region 3, will be described as followed.

In standard practice and in prior art, the circuits that attached to the inductor are located outside the inductor, region 1. In the preferred embodiment, if the area of the semiconductor island, region 3, is large, circuits can be placed on top of it and hence reduce the overall chip area. The interference from the inductor to the parallel metal lines inside the circuits can be minimized by 1) proper ground shield placed around the edges of the silicon island, 2) the parallel metal lines in the circuits are placed at least three times the average pitch (i.e. width plus spacing) of the lines that formed the inductor.

Figure 4A:
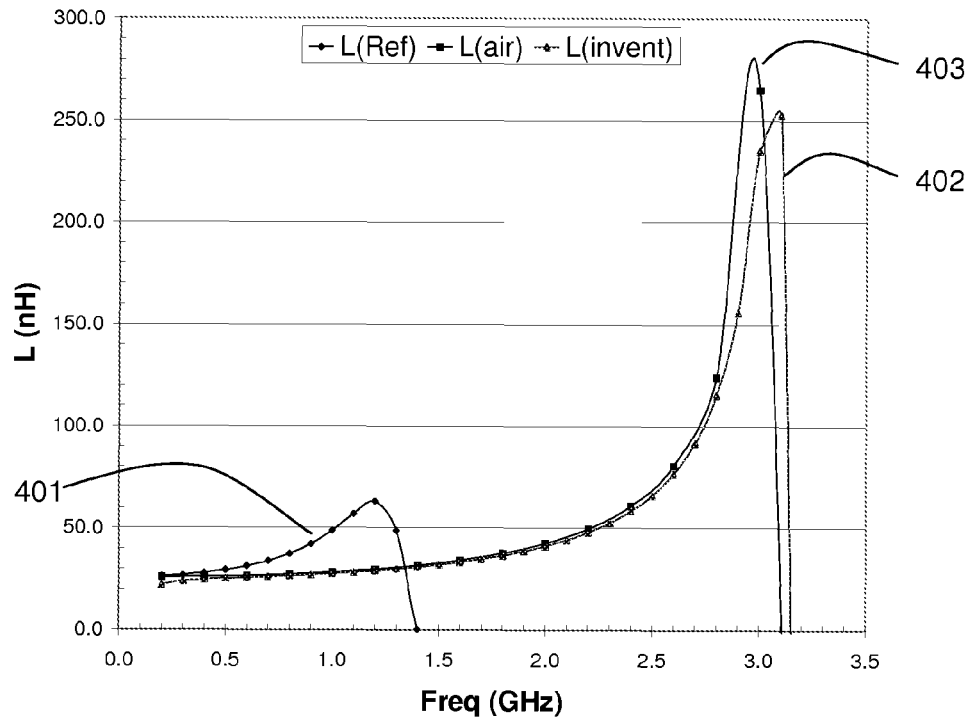
FIG. 4a shows a plot of inductance versus frequency for 3 different structures including the structure of this invention.

Referred now to FIG. 4a, wherein said a simulation result of inductance versus signal frequency is shown. The simulator is an electromagnetic 3D solver that uses method of moments solvers. The inductor used for the simulation is a 5 turns planar spiral copper inductor with an outer size of 1000 um×500 um, a width of each line of 15 um, a spacing between the lines of 5 um, and a conductor thickness of 3 um. The inductor sits on a 6 um oxide and 10 ohm.cm silicon substrate. Three different inductors were simulated. The inductor labeled "Ref" is a reference inductor with a whole 10 ohm.cm silicon substrate under the inductor. The inductor labeled "Prior art" is an inductor with silicon substrate removed completely below the inductor, as shown in FIG. 1. Finally, the inductor labeled "Invent" is an inductor with silicon substrate removed only in region 2, as mentioned previously. The distance, d, as shown in FIG. 3 is 20 um. The results show the inductance of the inductor labeled "Prior art", line 402, and the inductance of the inductor labeled "Invent", line 403, matching up very well, even as the resonant frequency sets in. This confirms the analysis discussed above. Also note that the inductance of the "Ref" inductor, line 401, is resonated at 1.4 GHz already. Hence by removing the silicon substrate under the inductor, the resonant frequency of the inductor is pushed up to 3.1 GHz, widening the usage range.

Figure 4B:
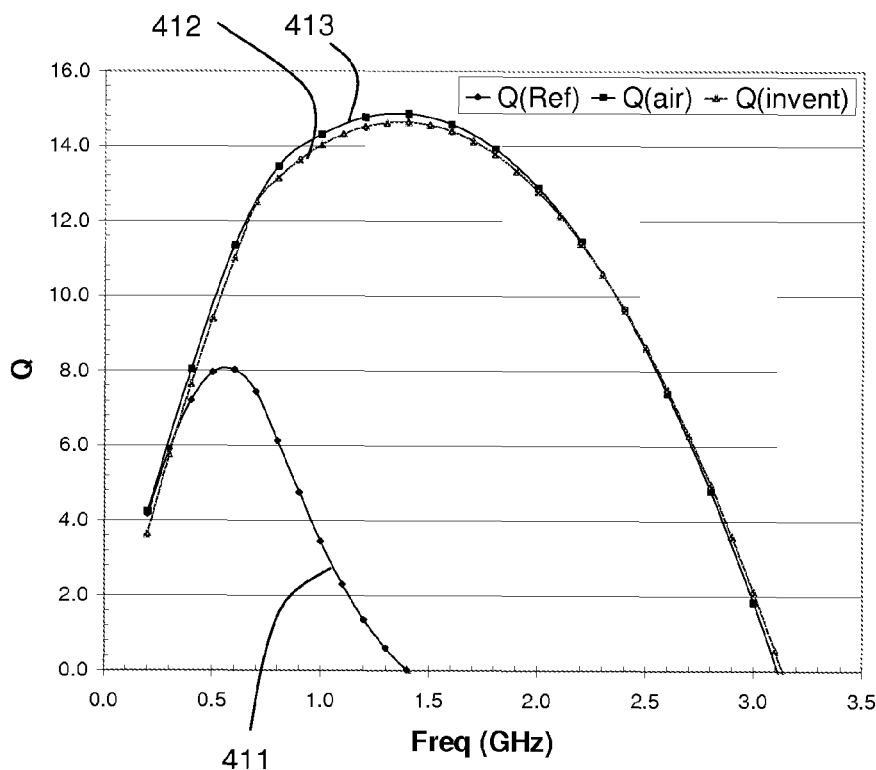
FIG. 4b shows a plot of quality factor versus frequency for 3 different structures including the structure of this invention.

The quality factor, Q, versus signal frequency of the 3 inductors is shown in FIG. 4b. Again, the results are as expected. Q of "Prior art" inductor, line 412, and Q of "Invent" inductor, line 413, are similar across all frequencies, and they are much higher than Q of "Ref" inductor, line 411, for frequency of 0.4 GHz and beyond. 0.4 GHz is where the capacitive loss and eddy loss start to cause the drop in Q for this big inductor. When the spiral inductor is used as an antenna, said an antenna of a RFID tag, Q is proportional with the induced voltage. In general, a higher Q results in longer read range. From FIG. 4b, at 900 MHz Q of the reference device is 4.74 and Q of the preferred embodiment is 13.61. Hence the induced voltage increases more than 3 times, or the read distance improves by 44%.

Figure 5A:
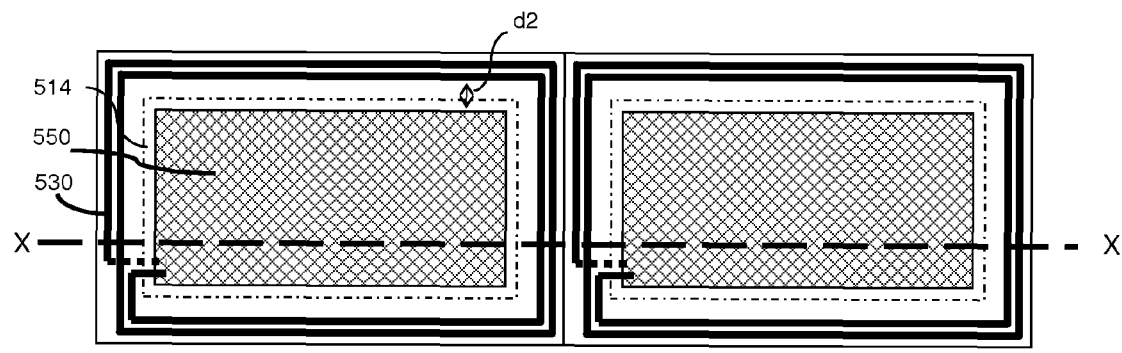
FIG. 5a shows the top view of an on chip antenna that makes use of the invention. The antenna is arranged around the circuit area, e.g. a RFID tag, and near the scribe lines that divide among the dies on a wafer.

Now refer to FIG. 5a. The top view of an integrated circuit, IC, that made used of the semiconductor island is shown. There are two ICs side by side. The two turn inductor, 530, in this case is used as an antenna. The rest of the IC, 550, is designed with a distance, d2, within the inductor. The IC can include both digital and analog/RF circuit blocks. As a RFID tag, the circuit can be comprised of memory blocks, microcontroller, RF module, capacitors, etc. The dotted line, 514, represents the boundary of the semiconductor island underneath.

Figure 5B:
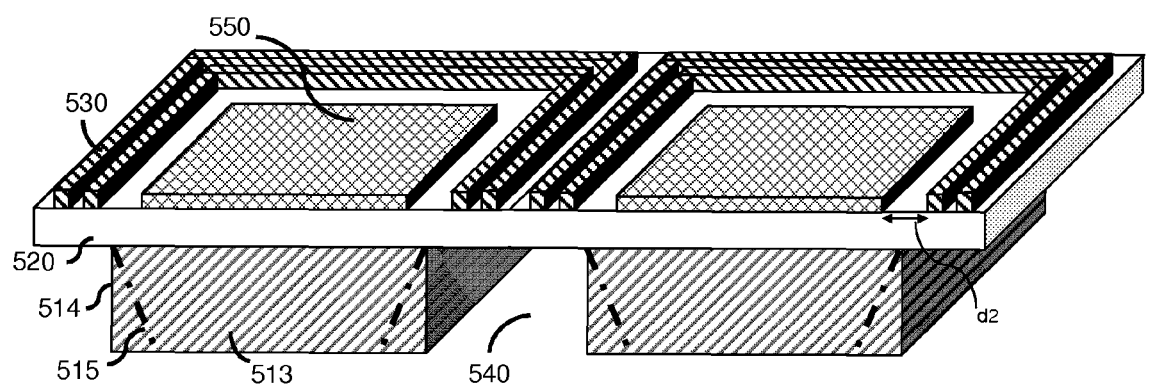
FIG. 5b shows the cross sectional view of an on chip antenna that makes use of the invention.

FIG. 5b shows the 3D cross-sectional view of the cross-sectional cut at X-X' in FIG. 5a. The antenna, 530, is normally designed using the top metal, or a stack of top few layers of metal, and it is insulated from the lossy semiconductor substrate by dielectric layers, 520. The dielectric layers can be silicon oxide, low-k materials, or other dielectric materials. After the semiconductor substrate is backgrinded to a predetermined thickness, it is etched from the back side, using a standard photolithography processing steps. A photolithography mask is aligned to the alignment marks on the front side and is opened to the area of the trenches' features, where subsequent deep etching would take place. The photoresist should have high selective to silicon etching, i.e. SiN, or a metal layer. The etching can be wet, dry or a combination of the two and is stopped when it reaches the bottom surface of the dielectric layer, 520. Note that with wet etch, the etch profile is at an angle, see the dotted line, 515. After etch, air trenches, 540, surrounding the semiconductor islands, 513, would be formed. The next processing steps are clean, resist strip, and clean. The wafer can be diced from the front or the back, using the marks on the front side of the wafer.

If the photoresist is a metal layer, then processing steps involving removing the photoresist is not necessary as the metal layer can be later used as a voltage reference, such as ground.

The trenching etching can also be realized by using laser, or focus ion beam.

To form an ultra thin wafer, the original wafer would be attached to a holding substrate (i.e. glass substrate) on the front side. Using a combination of back side grinding and wet chemical etching, it has been reported that 200 mm diameter silicon wafer can be thinned down to 50 um. The reason for thinning down the wafer is to reduce the trench etching time and for better heat dissipation if required. However, silicon is brittle. Ultra thin wafer is harder to carry around. Using the TAIKO process developed by DISCO in thinning wafer and in handling of thin wafer during the processing steps of photolithography, etching, cleaning, and dicing, may be a solution. The TAIKO process is described on this website link "http://www.discosin.com.sg/eg/solution/library/taiko.html."

Figure 6A:
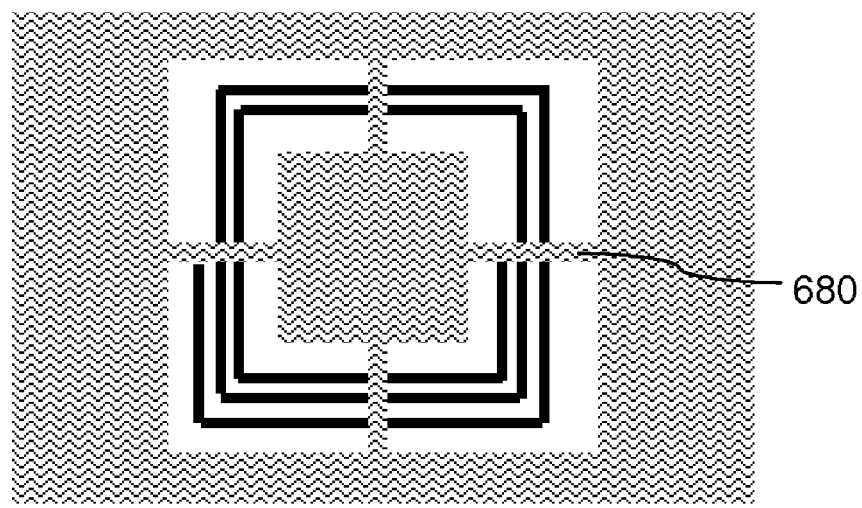
FIG. 6a shows the bottom view of an on chip antenna that includes additional supports, which link the central silicon island with the rest of the silicon substrate.
Figure 6B:
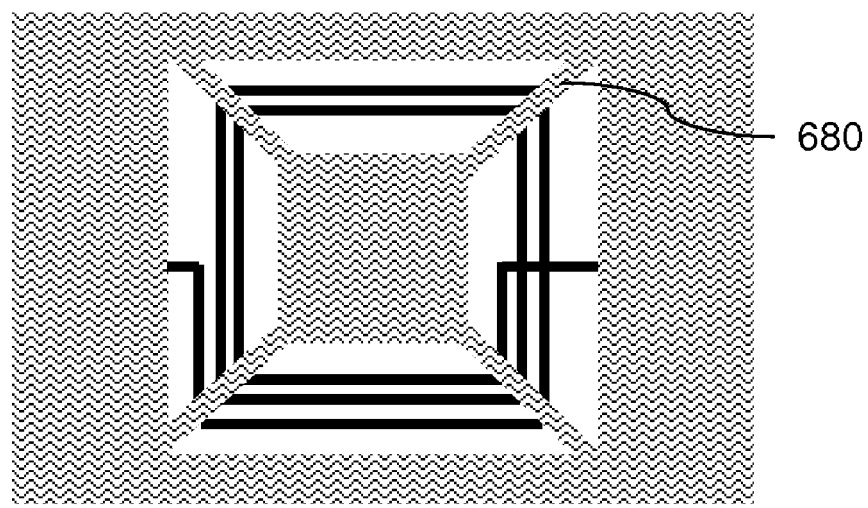
FIG. 6b shows the bottom view of another on chip antenna that includes additional supports, which link the central silicon island with the rest of the silicon substrate.

To make the chips more mechanically robust, additional posts, 680 that link the semiconductor islands to the rest of the substrate are designed. FIGS. 6a and 6b show some variations of the added posts. They are viewed from the bottom of the chip.

The same principle can be implemented to circuits built on semiconductor-on-insulator, such as silicon-on-insulator (SOI), wafers. There are additional processing steps to remove not only the bulk silicon of the "handle" substrate, but the top silicon as well.

Figure 7:
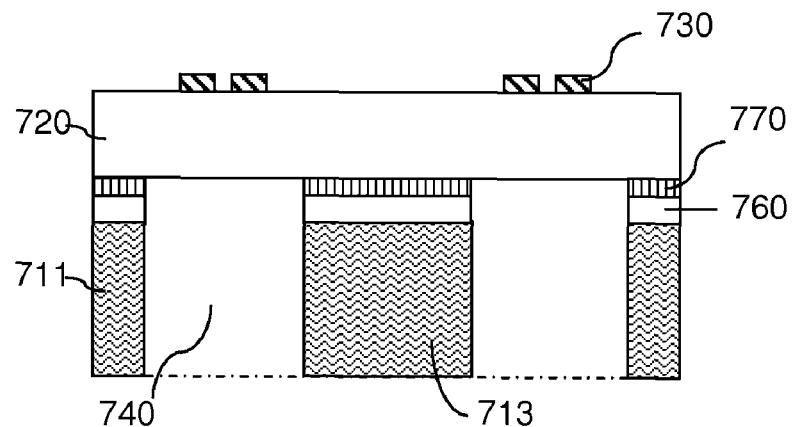
FIG. 7 shows the cross section view of an antenna, using a spiral inductor, sitting on a silicon-on-insulator (SOI) wafer.

FIG. 7 shows a cross section of an SOI substrate at the final processing step. Initially, the bulk silicon of the "handle" substrate, 710, is partially removed, with silicon island, 713, untouched. The etching is stopped when it reaches the insulator layer, 760. Using the silicon walls just etched as a mask, further etching on the silicon oxide, 760, is followed. And finally, etch the top silicon, 770.

Figure 8:
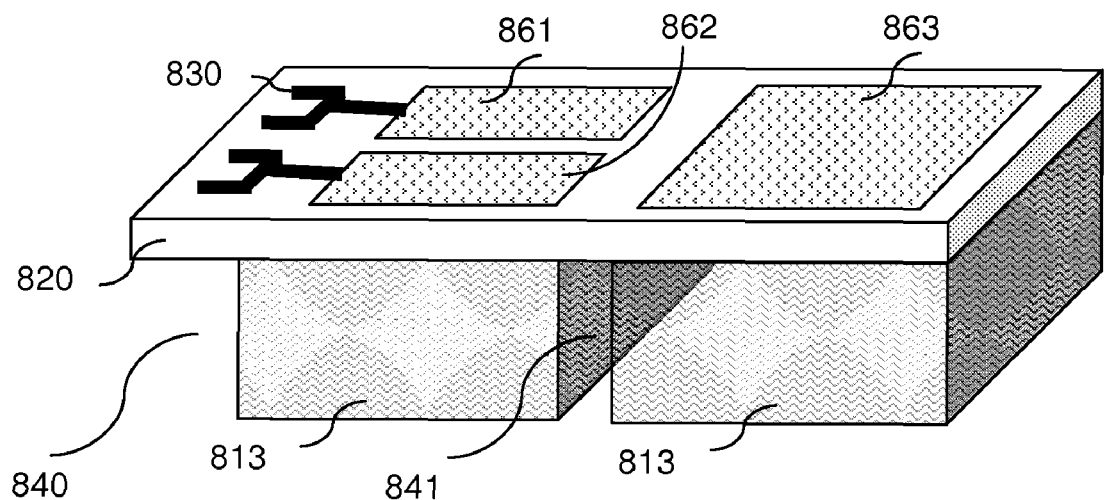
FIG. 8 shows a RF transceiver that uses air-filled antenna and air-filled trench to reduce substrate noise coupling between digital and analog/RF circuit blocks.

FIG. 8 shows another embodiment of the present invention, air-filled trenches being used to reduce noise coupling between digital and analog/RF circuit blocks in a system-on-chip IC, at the same time as being used to improve the range of the antenna. It has a transmitting circuit, 862, a receiving circuit, 861, and a digital circuit, 863, all sitting on a dielectric, 820, and a semiconductor substrate. Air-filled trench, 840, under the metal lines that formed the antenna, 830, and air-filled trench, 841, between the digital circuit and analog/RF transmitting and receiving circuits are created as the substrate is being selectively etched off from the backside until all substrate material inside the trenches are removed. The remaining substrate, 813, may be held together by semiconductor posts. Noted that even with air-filled trenches, proper grounding, shielding, signal routing, timing of logic and other circuit techniques are still very important to optimize the performance of the system-on-chip IC.

While the invention has been described in terms of the preferred embodiments, those skilled in the art will recognize that various changes in form and details may be made without departing from the spirit and scope of the invention.

What is claimed is:

1. A method of improving the range of an antenna attached to a monolithic integrated circuit by reducing electromagnetic losses incurred in semiconductor substrate comprising the steps of:
    providing a semiconductor substrate having a top and bottom surfaces;
    forming a plurality of circuit elements that include active and passive components on the top surface of the semiconductor substrate;
    forming multilevel interconnects layers that include metal lines, vias, contacts, and insulators to interconnect among the circuit elements;
    forming an antenna with a top metallization layer, the antenna electrically coupled to at least one of the circuit elements, the antenna being spiral-shaped, and the antenna being laid out along the edges of a die that contains part of or all of the integrated circuit inside the antenna and a distance away from other parallel interconnects and circuit elements;
    forming proper grounding structures to reduce the electromagnetic interference between the antenna and the rest of the integrated circuit;
    forming an air-filled trench in the area directly underneath metal lines that made up the spiral-shaped antenna, the width of the trench being equal or larger than the width of all the metal lines that made up the antenna, the trench being formed by selectively etching the semiconductor substrate from its bottom surface to its top surface wherein the semiconductor substrate lying over a buried oxide and a handling semiconductor substrate; wherein additional steps of thinning down the handling semiconductor substrate, and of etching through the handling semiconductor substrate, the buried oxide, and the top semiconductor substrate to formed the air-filled trench.

2. The method of claim 1, with additional step of thinning down the semiconductor substrate before forming the trench.

3. A monolithic integrated circuit with a low loss antenna comprising:
    a semiconductor substrate having a top and bottom surfaces;
    a plurality of circuit elements that include active and passive components formed on the top surface of the semiconductor substrate;
    multilevel interconnects layers formed by metal layers and insulator layers that include metal lines, vias, contacts, and insulators to interconnect among the circuit elements;
    an antenna formed by a top metallization layer the antenna electrically coupled to at least one of the circuit elements, the antenna is spiral-shaped, and the antenna being laid out along the edges of a die that contains part of or all of the integrated circuit inside the antenna and a distance away from other parallel interconnects and circuit elements;
    grounding structures to reduce the electromagnetic interference between the antenna and the rest of the integrated circuit;
    an air-filled trench formed in the area directly underneath metal lines that made up the spiral-shaped antenna, the width of the trench being equal or larger than the width of all the metal lines that made up the antenna, the trench being formed by selectively etching the semiconductor substrate from its bottom surface to its top surface wherein the semiconductor substrate lying over a buried oxide and a handling semiconductor substrate; wherein additional steps of thinning down the handling semiconductor substrate, and of etching through the handling semiconductor substrate, the buried oxide, and the top semiconductor substrate to formed the air-filled trench.

4. The integrated circuit of claim 3, wherein the antenna formed by a single metal layer, stacked metal layers, or multi metal layers, wherein the metal layers are sandwiched with insulator layers.

5. The integrated circuit of claim 3, wherein the spiral of the antenna is one of a square, a rectangular, a polygon, or a circular shaped.

6. The integrated circuit of claim 3, wherein the spiral-shaped antenna is a single turn or multiple turns spiral, and each turn has a width and spacing between the turns.

7. The integrated circuit of claim 3, whereas there are semiconductor posts linking various semiconductor islands that are separated by trenches on a wafer to improve mechanical integrity.

* * * * *